United States Patent

Hama

[11] Patent Number: 6,149,760
[45] Date of Patent: Nov. 21, 2000

[54] PLASMA PROCESSING APPARATUS

[75] Inventor: Kiichi Hama, Chino, Japan

[73] Assignees: Tokyo Electron Yamanashi Limited, Nirasaki; Japan Science and Technology Corporation, Kawaguchi, both of Japan

[21] Appl. No.: 09/173,179

[22] Filed: Oct. 15, 1998

[30] Foreign Application Priority Data

Oct. 20, 1997 [JP] Japan .................................. 9-306659

[51] Int. Cl.⁷ .............................. H05H 1/00; C23C 16/00
[52] U.S. Cl. ........................................ 156/345; 118/723 I
[58] Field of Search ......................... 156/345; 118/723 I, 118/723 E, 723 MW, 723 MR

[56] References Cited

U.S. PATENT DOCUMENTS 4,497,875  2/1985  Arakawa et al. ........................ 428/620
5,433,812  7/1995  Cuomo et al. ........................... 156/345

FOREIGN PATENT DOCUMENTS

97/08734  3/1997  WIPO .............................. H01J 37/32

Primary Examiner—Gregory Mills
Assistant Examiner—Parviz Hassanzadeh
Attorney, Agent, or Firm—Oblon, Spivak, McClelland, Maier & Neustadt, P.C.

[57] ABSTRACT

An inductively coupled type dry etching apparatus has a spiral RF antenna disposed on the ceiling wall of a process chamber. A susceptor is arranged in the process chamber, for mounting a semiconductor wafer thereon. The ceiling wall has upper and lower layers with a dielectric matrix, and a conductive Faraday shield layer sandwiched therebetween. The Faraday shield layer has a plurality of slits radially arranged. The matrix of the upper and lower layers and the Faraday shield layer are set to have coefficients of thermal expansion close to each other, and/or the Faraday shield layer is set to have a very small thickness.

14 Claims, 4 Drawing Sheets

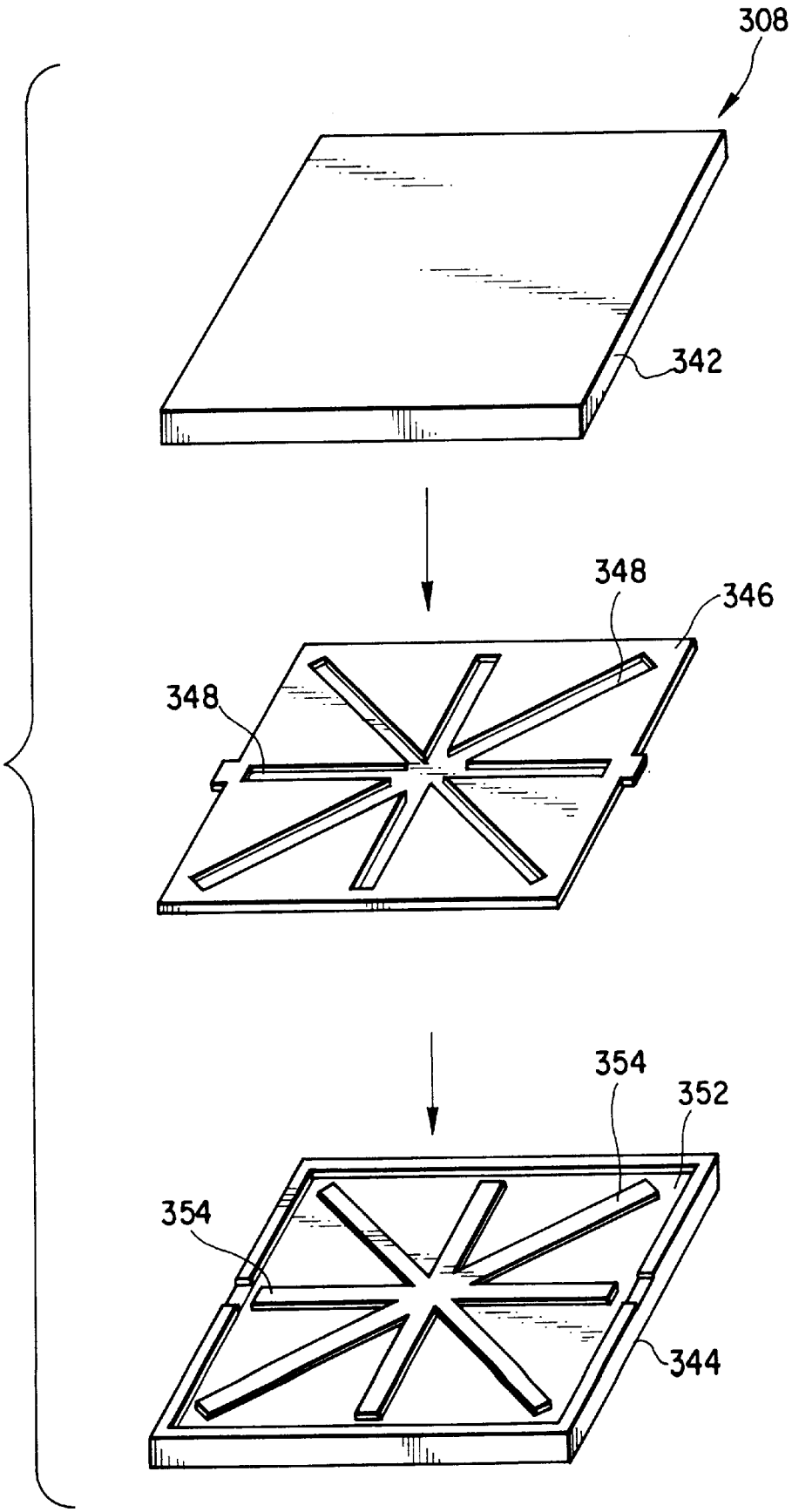

PLASMA PROCESSING APPARATUS

BACKGROUND OF THE INVENTION

The present invention relates to an apparatus for subjecting a target object to a plasma process in a semiconductor processing system by using a plasma and, more particularly, to an inductively coupled type dry etching apparatus. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

As a plasma processing apparatus used in semiconductor processing systems, there is an inductively coupled type dry etching apparatus. This dry etching apparatus generally has a process chamber with a ceiling of a dielectric wall, on which an annular or spiral RF (radio-frequency) antenna is disposed.

During a plasma process, the RF antenna and a plasma excited in the process chamber are coupled not only inductively but also capacitively. Consequently, the inner surface of the dielectric wall made of, e.g., quartz, which is exposed to the interior atmosphere of the process chamber near the RF antenna, is charged with a negative bias relative to the plasma. With the potential difference between the plasma and the exposed inner surface of the dielectric wall, positive ions in the plasma collide with the exposed inner surface while being accelerated. As a result, problems arise in that contaminants are produced in the process chamber and the dielectric wall is worn off quickly.

In order to cope with these problems, Jpn. Pat. Appln. KOKAI Publication No. 8-153702, corresponding to U.S. Pat. application Ser. No. 08/005,678 now U.S. Pat. No. 5,433,812 filed on Jan. 19, 1993, discloses a conductive Faraday shield to be arranged between a dielectric window and an insulating layer under an RF antenna. The capacitive coupling between the RF antenna and the plasma is broken off by the Faraday shield, so that the exposed inner surface of the dielectric wall is prevented from being collided into by accelerated positive ions from the plasma. However, where the Faraday shield is used, thermal stress is caused among the dielectric window, insulating layer, and the RF antenna due to an inductive heating, thereby generating cracks therein.

BRIEF SUMMARY OF THE INVENTION

It is an object of the present invention to provide a plasma processing apparatus having a Faraday shield, which presents a more excellent performance than that of the above related arts.

According to the present invention, there is provided an apparatus for subjecting a target object to a plasma process by using a plasma. The apparatus comprises an airtight process chamber formed in a process vessel; a support member arranged in the process chamber, for supporting the target object in the process chamber; a gas supply system for supplying a process gas into the process chamber; an exhaust system for exhausting and setting the process chamber at a vacuum; an RF antenna for generating an RF electric field for exciting the process gas in the process chamber to convert the process gas into a plasma, the electric field having an electric field direction which is defined essentially by lines of electric force extending substantially parallel to the target object supported by the support member; a power supply for supplying an RF power to the RF antenna; and an interposed wall which has an exposed inner surface exposed to the process chamber and is interposed between the process chamber and the RF antenna.

In a first aspect of the present invention, the interposed wall has a dielectric matrix layer and a conductive Faraday shield layer arranged in the matrix layer to extend on a plane substantially parallel to the electric field direction. The Faraday shield layer is electrically grounded. Where coefficients of thermal expansion of the matrix layer and the Faraday shield layer are CT1 and CT2, respectively, $0.7 \leq CT1/CT2 \leq 1.7$ is satisfied.

In a second aspect of the present invention, the interposed wall has a dielectric matrix layer and a conductive Faraday shield layer arranged in the matrix layer to extend on a plane substantially parallel to the electric field direction. The Faraday shield layer is electrically grounded. The Faraday shield layer has a thickness of about 10 to 100 $\mu$m.

In a third aspect of the present invention, the interposed wall has a dielectric matrix layer and a conductive Faraday shield layer arranged in the matrix layer to extend on a plane substantially parallel to the electric field direction. The Faraday shield layer is electrically grounded. The Faraday shield layer is a layer formed by subjecting the matrix layer to doping.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is an exploded perspective view showing a multilayer wall used as a modification of the ceiling wall or the partition wall.

DETAILED DESCRIPTION OF THE INVENTION

Figure 1:
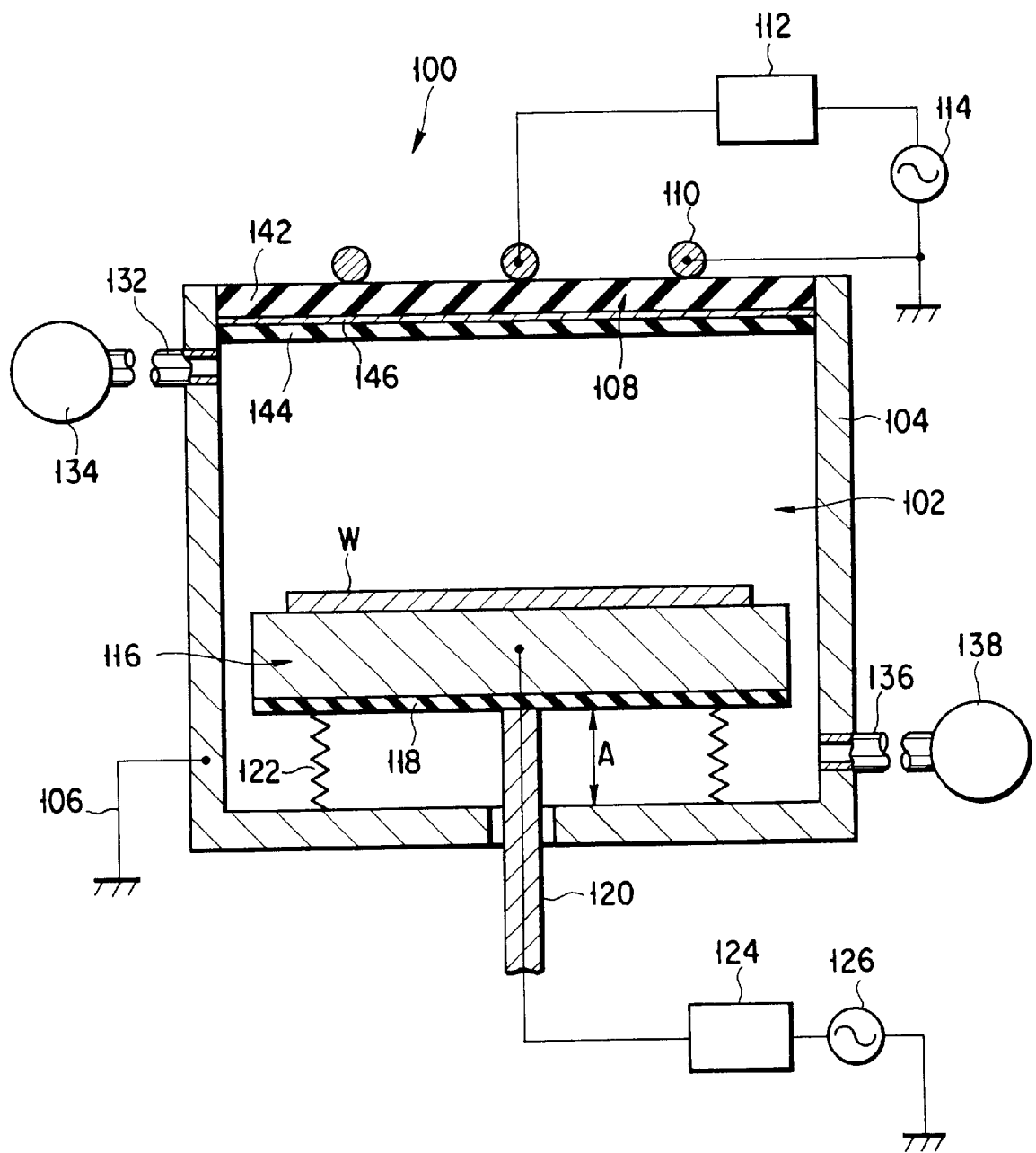
FIG. 1 is a schematic diagram showing an etching apparatus according to an embodiment of the present invention.

Prior to developing the present invention, the present inventor conducted various experiments in inductively coupled type plasma processing apparatuses with a Faraday shield. Through the experiments, the present inventor obtained the following findings.

Where a Faraday shield is arranged in a process chamber, the shield may be exposed to the plasma, thereby causing problems, such as contamination. Where a metal Faraday shield is simply embedded in the dielectric wall, since the coefficient of thermal expansion of the dielectric wall differs from that of the Faraday shield, cracks may be generated in the dielectric wall due to repeated thermal expansion and contraction over a long period of time.

Embodiments of the present invention that are made on the basis of these findings will be described hereinafter with reference to the accompanying drawings. In the following description, the constituent elements having substantially the same function and arrangement are denoted by the same reference numerals, and repetitive descriptions will be made only when necessary.

FIG. 1 is a schematic diagram showing an inductively coupled type dry etching apparatus 100 according to an embodiment of the present invention.

Figure 2:
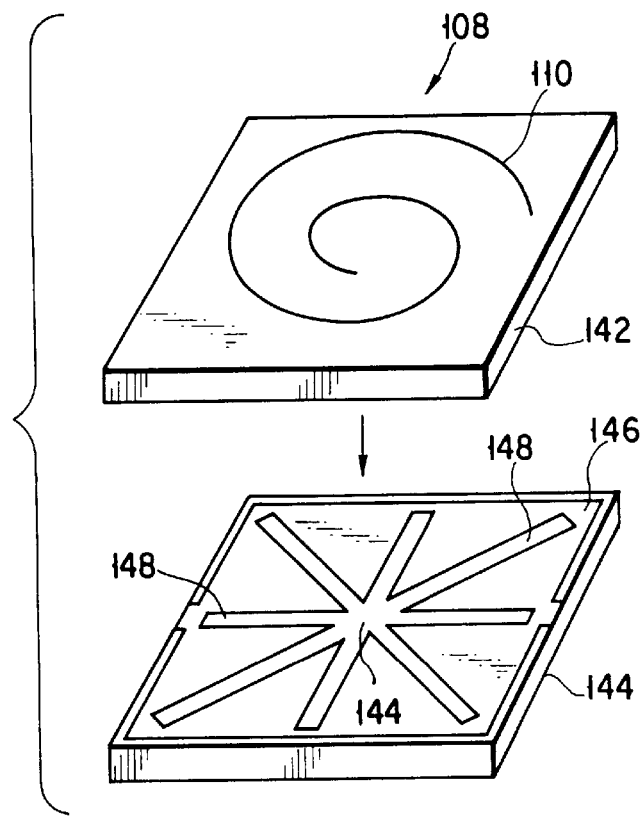
FIG. 2 is an exploded perspective view showing an RF antenna and a ceiling wall used in the apparatus shown in FIG. 1.

An airtight process chamber 102 of the etching apparatus 100 is constituted by a substantially cylindrical process vessel 104 made of a conductive material, such as stainless steel, and a ceiling wall 108 consisting essentially of a dielectric material. The process vessel 104 itself is grounded through a ground line 106. The ceiling wall 108 will be explained later in detail. As shown in FIG. 2, a spiral RF (radio-frequency) antenna 110 is arranged on the ceiling wall 108. The RF antenna 110 is connected, through a matching unit 112, to a first RF power supply 114 which can output a plasma generating RF power, such as an RF power of 13.56 MHz.

A susceptor 116 made of a conductive material and forming a lower electrode is arranged in the lower portion of the process chamber 102. A semiconductor wafer W is placed on the work surface of the susceptor 116 and fixed thereto by, e.g., an electrostatic chuck (not shown). An elevating shaft 120 is mounted on the susceptor 116 through an insulating member 118 arranged on the bottom surface portion of the susceptor 116. The elevating shaft 120 is connected to an elevating mechanism (not shown). Accordingly, upon operation of the elevating mechanism, the susceptor 116 can be vertically moved (in the direction of the double-headed arrow A in FIG. 1) through the elevating shaft 120. A bellows 122 made of an airtight member is mounted on the insulating member 118 around the elevating shaft 120 and the bottom surface of the process chamber 102 to extend between them. Hence, even if the susceptor 116 is moved vertically, the airtightness in the process chamber 102 is not impaired. The susceptor 116 is connected, through a matching unit 124, to a second RF power supply 126 that can output a bias RF power, such as an RF power of 380 kHz.

The process chamber 102 is connected to a gas supply line 132 of a process gas supply system. The gas supply line 132 is connected to a gas source unit 134 through an opening/closing valve and a flow control valve (not shown). The gas source unit 134 has gas sources of a plurality of different gases to be supplied to the process chamber 102, e.g., $CF_4$, $C_4F_8$, $CO$, $O_2$, $Ar$, and $N_2$.

The process chamber 102 is connected to an exhaust line 136 of the exhaust system. The exhaust line 136 is connected to an exhaust pump 138 through an opening/closing valve and a flow control valve (not shown). The exhaust pump 138 can exhaust the process chamber 102 and set the process chamber 102 at a vacuum of, e.g., from 10 mTorr to 100 mTorr.

In the etching apparatus 100 shown in FIG. 1, a process is performed as follows.

First, the wafer W is placed on the susceptor 116 arranged in the process chamber 102. Subsequently, the process chamber 102 is exhausted by the exhaust system connected to the process chamber 102, thereby setting the entire interior of the process chamber 102 to a predetermined pressure-reduced atmosphere. While the process chamber 102 is continuously exhausted, a process gas is supplied from the process gas supply system to the process chamber 102.

In this state, a plasma generating RF power is applied to the RF antenna 110 so that the process gas supplied to the process chamber 102 is excited and dissociated, thereby generating a high-density plasma. Simultaneously, a bias RF power is applied to the susceptor 116 to guide an etchant in the plasma onto the surface of the wafer W, thereby etching the wafer W.

FIG. 2 is an exploded perspective view showing the RF antenna 110 and the ceiling wall 108 used in the apparatus 100 shown in FIG. 1.

As shown in FIG. 2, the ceiling wall 108 has an upper layer 142 and a lower layer 144 which have a dielectric matrix and are integrated with each other by sintering. A conductive Faraday shield layer 146 is interposed and expanded horizontally between the upper and lower layers 142 and 144. The Faraday shield layer 146 is connected to a process vessel 104 by a conductive portion and is grounded. The capacitive coupling between the RF antenna 110 and the plasma is broken off by the Faraday shield layer 146. As a result, it is possible to prevent the inner surface of the ceiling wall 108 exposed to the process chamber 102 from being charged with a negative bias and sputtered by positive ions in the plasma during a plasma process.

The Faraday shield layer 146 is not exposed to any plasma, thereby preventing some problems, such as contamination in the process chamber 102. Further, the distance between the wafer W and the Faraday shield layer 146 should be constant in order to ensure a high planar uniformity of the process on the wafer W. Since the wafer W is horizontally placed on the horizontal surface of the susceptor 116, the Faraday shield layer 146 is also horizontally arranged.

In order to prevent the Faraday shield layer 146 from being inductively heated, and to effectively use the input energy form the RF antenna 110 for generating the plasma, no electric current passageway should be formed in any direction the same as that of an RF electric field. The RF antenna 110 is formed of a spiral coil which is arranged to have a geometric center aligning with that of the wafer W placed on the susceptor 116. Consequently, the RF electric field generated by the RF antenna 110 has an electric field direction which is defined mainly by lines of electric force concentrically surrounding the center.

For this reason, the Faraday shield layer 146 is provided with a plurality of slits 148 which are arranged essentially radial and equidistant. The center of the radial shape of the slits 148 aligns with the geometric centers of the RF antenna 110 and the wafer W placed on the susceptor 116. In other words, the slits 148 extend in directions which are substantially perpendicular to the direction of the RF electric field generated by the RF antenna 110. With this arrangement, the magnetic field generated by the RF antenna 110 is transmitted into the process chamber 102 without being cut off, so that the RF electric field is generated in the process chamber 102, while capacitive component is considerably reduced. As a result, the input energy from the RF antenna 110 is effectively used for generating the plasma.

In order to decrease thermal stress to be applied to the ceiling wall 108, the matrix of the upper and lower layers 142 and 144 and the Faraday shield layer 146 are set to have coefficients of thermal expansion close to each other; and/or the Faraday shield layer 146 is set to have a very small thickness.

The thickness of the Faraday shield layer 146 is set preferably at about 10 to 100 μm and, more preferably at about 10 to 50 μm. With this arrangement, even if the ceiling wall 108 is used over a long period of time, and its thermal expansion and contraction are repeated, thermal stress applied to the ceiling wall 108 is small and hardly any cracks are generated in the ceiling wall 108.

The ceiling wall 108 may be formed in accordance with a method (first method), as follows.

First, the main surface of a first aluminum nitride (AlN) substrate containing a sintering aid is covered with a conductive paste with a predetermined pattern, and then is dried. The conductive paste is prepared by mixing a powder of, e.g., 0.8 wt % TiN (titanium nitride) and 99.2 wt % W (tungsten) with a binder of, e.g., ethyl cellulose, a plasticizer of, e.g., dibutylphthalate, and an organic solvent of, e.g., α-terpineol.

Then, a second aluminum nitride substrate having the same composition as the first aluminum nitride substrate is prepared and stacked on the first aluminum nitride substrate to sandwich the conductive paste therebetween. The stacked first and second aluminum nitride substrates are subjected to a binder-removing treatment, and then are sintered at 1,850° C. for four hours in a nitrogen atmosphere. With this process, a sintered plate is obtained, such that a W layer is sandwiched by upper and lower dielectric layers of aluminum nitride.

In this multi-layer structure for forming the ceiling wall 108, the W layer functions as the Faraday shield layer 146, and the upper and lower dielectric layers of aluminum nitride function as the upper and lower layers 142 and 144, respectively, sandwiching the Faraday shield layer 146. Since aluminum nitride and tungsten have almost the same coefficient of thermal linear expansion as each other, which is about $4.5 \times 10^{6\circ}$ C.$^{-1}$, the ceiling wall 108 is burdened with a small thermal stress, when it is thermally expanded and contracted.

In the first method, a carbon paste may be used as the conductive paste, relative to the first and second substrates of aluminum nitride. With this process, a sintered plate is obtained, such that a carbon layer is sandwiched by upper and lower dielectric layers of aluminum nitride. The coefficient of thermal linear expansion of carbon falls in a wide range of about $2.3 \times 10^{-6}$ to $9.0 \times 10^{-6\circ}$C.$^{-1}$, and thus a specific carbon material can be selected in accordance with the coefficient of thermal linear expansion of aluminum nitride, i.e., about $4.5 \times 10^{-6\circ}$C.$^{-1}$. In the experiment, a ceiling wall 108 was fabricated, using a carbon Faraday shield layer having a coefficient of thermal linear expansion of about $6.8 \times 10^{-6\circ}$C.$^{-1}$, and no problem arose in a general service period of time.

In the first method, alumina ($Al_2O_3$) may be used as the material of the first and second substrates, relative to the above described tungsten conductive paste. In this case, the sintering temperature is set at 1500° C. With this process, a sintered plate is obtained, such that a W layer is sandwiched by upper and lower dielectric layers of alumina. The coefficient of thermal linear expansion of alumina is about $7.8 \times 10^{-6\circ}$C.$^{-1}$, while that of tungsten is about $4.5 \times 10^{-6\circ}$ C.$^{-1}$. In the experiment, a ceiling wall 108 having such a multi-layer structure was fabricated, and no problem arose in a general service period of time.

Other experiments were further conducted to investigate the relationship between the materials of the ceiling wall 108 and thermal stress to be applied thereto. As a result, it has been found that, where coefficients of thermal expansion of the matrix of the ceiling wall 108, i.e., the upper and lower dielectric layer 142 and 144, and that of the Faraday shield layer are CT1 and CT2, respectively, and $0.7 \leq (CT1/CT2) \leq 1.7$ is satisfied, no problem arise in a general service period of time.

The ceiling wall 108 may also be formed in accordance with another method (second method), as follows.

First, the main surface of an alumina substrate is covered and impregnated with a copper sulfate solution with a predetermined pattern, and then is dried. The resultant structure is heated at 1,000° C. for one hour in a nitrogen atmosphere. Then, alumina is applied onto the main surface of the alumina substrate by means of thermal spraying, and solidified thereon. With this process, a multi-layer structure is obtained, such that a conductive layer doped with Cu (copper) is sandwiched by upper and lower dielectric layers of alumina.

In this multi-layer structure for forming the ceiling wall 108, the conductive layer functions as the Faraday shield layer 146, and the upper and lower dielectric layers of alumina function as the upper and lower layers 142 and 144, respectively, sandwiching the Faraday shield layer 146. Since the conductive layer is formed by subjecting the alumina matrix to doping, the alumina dielectric layers are hardly broken by thermal stress.

The ceiling wall 108 may also be formed in accordance with still another method (third method), as follows.

First, Cu is deposited on the main surface of an alumina substrate by means of CVD (Chemical Vapor Deposition) and is etched to have a predetermined pattern. Then, alumina is applied onto the main surface of the alumina substrate by means of thermal spraying, and solidified thereon. With this process, a multi-layer structure is obtained, such that a thin Cu layer having a thickness within the above described range is sandwiched by upper and lower dielectric layers of alumina. In this multi-layer structure for forming the ceiling wall 108, the Cu layer functions as the Faraday shield layer 146, and the upper and lower dielectric layers of alumina function as the upper and lower layers 142 and 144, respectively, sandwiching the Faraday shield layer 146.

The ceiling wall 108 may also be formed in accordance with still another method (fourth method), as follows.

First, Al (Aluminum) is deposited on the main surface of an alumina substrate by means of sputtering (Physical Vapor Deposition) and is etched to have a predetermined pattern. Then, alumina is applied onto the main surface of the alumina substrate by means of thermal spraying, and solidified thereon. With this process, a multi-layer structure is obtained, such that a thin Al layer having a thickness within the above described range is sandwiched by upper and lower dielectric layers of alumina. In this multi-layer structure for forming the ceiling wall 108, the Al layer functions as the Faraday shield layer 146, and the upper and lower dielectric layers of alumina function as the upper and lower layers 142 and 144, respectively, sandwiching the Faraday shield layer 146.

Figure 3:
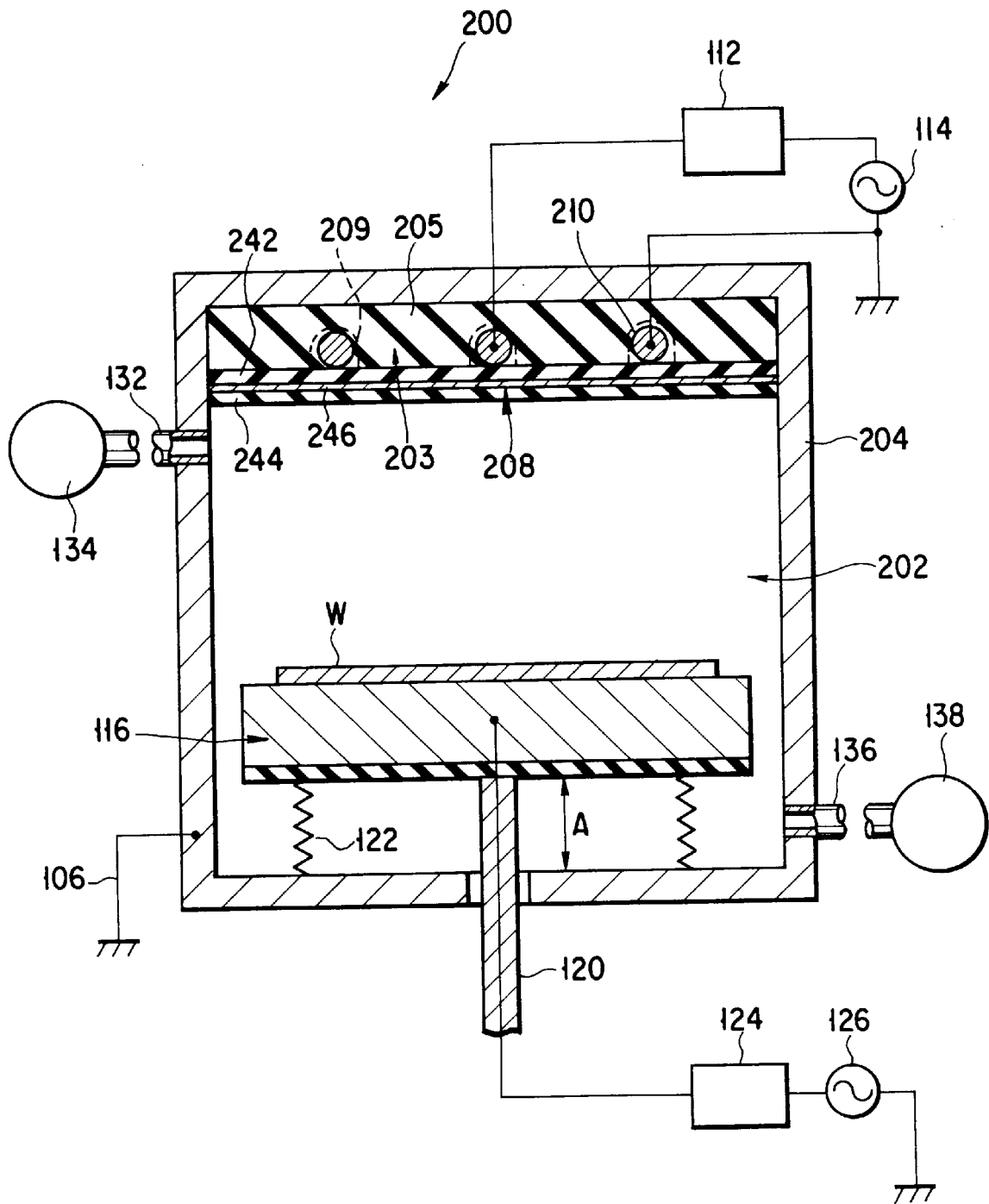
FIG. 3 is a schematic diagram showing an etching apparatus according to another embodiment of the present invention.

FIG. 3 is a schematic diagram showing an inductively coupled type dry etching apparatus 200 according to another embodiment of the present invention.

As shown in FIG. 3, the etching apparatus 200 differs from the etching apparatus 100 shown in FIG. 1 in that an RF antenna 210 is arranged in a process vessel 204.

Specifically, the etching apparatus 200 has the process vessel 204 which is substantially cylindrical and airtight, and is made of a conductive material, such as stainless steel. The process vessel 204 is divided by a partition wall 208 consisting essentially of a dielectric material into airtight process and antenna chambers 202 and 203. The structure on the process chamber 202 side is essentially the same as that of the etching apparatus 100 shown in FIG. 1.

The antenna chamber 203 is completely filled with a filling layer 205 formed of a non-compacted powder of dielectric material, such as mica. In the lower portion of the filling layer 205, a spiral and band-like RF (radio-frequency) antenna 210 made of a conductive material, such as copper foil, is embedded. The RF antenna 210 is provided with a number of notches on the inside of its curve to absorb thermal stress. The RF antenna 210 is connected, through a matching unit 112, to a first RF power supply 114 which can output a plasma generating RF power, such as an RF power of 13.56 MHz.

The filling layer 205 may be formed by compacting a dielectric material powder or by molding a dielectric material. In this case, it is preferable to form a small bore 209 surrounding the RF antenna 210, as indicated with broken lines in FIG. 3, to prevent cracks from being generated in the filling layer 205 due to thermal expansion of the RF antenna 210. Instead, the antenna chamber 203 may not be filled with any dielectric material, but accommodate only the RF antenna 210. In this case, it is preferable to keep the antenna chamber 203 at a pressure of 100 Torr or more, in order not to excite a plasma therein.

Figure 4:
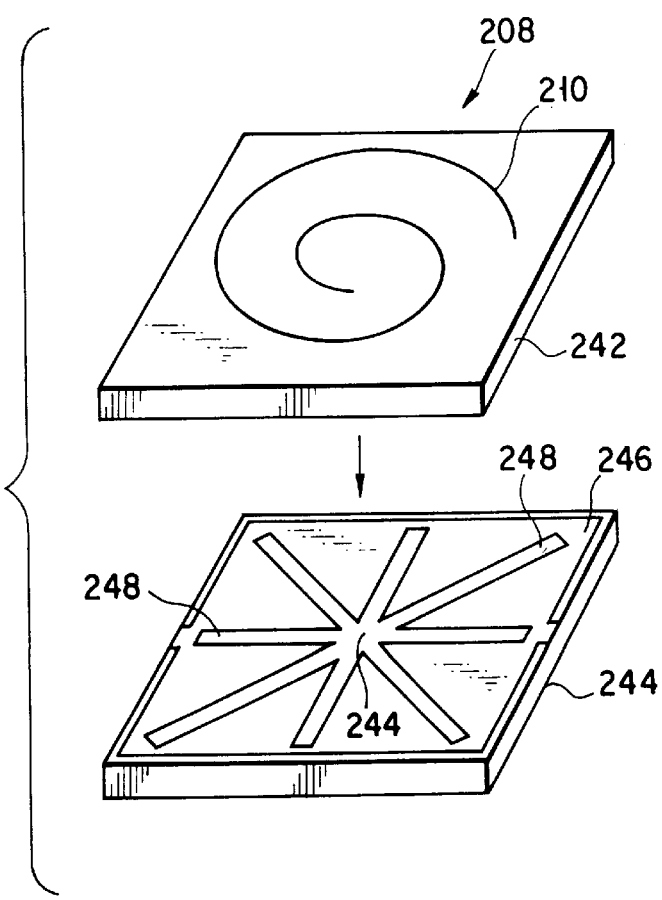
FIG. 4 is an exploded perspective view showing an RF antenna and a partition wall used in the apparatus shown in FIG. 3.

FIG. 4 is a cross-sectional view showing the RF antenna 210 and the partition wall 208 used in the apparatus 200 shown in FIG. 3.

As shown in FIG. 4, the partition wall 208 has an upper layer 242 and a lower layer 244 which have a dielectric matrix and are integrated with each other by sintering. A conductive Faraday shield layer 246 is interposed and expanded horizontally between the upper and lower layers 242 and 244. The Faraday shield layer 246 is connected to a process vessel 204 by a conductive portion and is grounded.

The Faraday shield layer 246 is provided with a plurality of slits 248 which are arranged essentially radial and equidistant. The center of the radial shape of the slits 248 aligns with the geometric centers of the RF antenna 210 and the wafer W placed on the susceptor 116. In other words, the slits 248 extend in directions which are substantially perpendicular to the direction of the RF electric field generated by the RF antenna 210.

The matrix of the upper and lower layers 242 and 244 and the Faraday shield layer 246 are set to have coefficients of thermal expansion close to each other; and/or the Faraday shield layer 246 is set to have a very small thickness. As described above, where coefficients of thermal expansion of the matrix of the partition wall 208, i.e., the upper and lower dielectric layer 242 and 244, and that of the Faraday shield layer are CT1 and CT2, respectively, $0.7 \leq (CT1/CT2) \leq 1.7$ is satisfied. The thickness of the Faraday shield layer 246 is set preferably at about 10 to 100 $\mu$m and, more preferably at about 10 to 50 $\mu$m.

The partition wall 208 can be fabricated, using any one of the first to fourth methods described above in relation to the ceiling wall 108. Accordingly, no explanation will be given on a method of fabricating the partition wall 208.

According to the etching apparatus 200 shown in FIG. 3, which employs the ceiling wall 208 shown in FIG. 4, advantages the same as in the apparatus shown in FIG. 1 are obtained, as follows.

The capacitive coupling between the RF antenna 210 and the plasma is broken off by the Faraday shield layer 246. The Faraday shield layer 246 is not exposed to any plasma, thereby preventing some problems, such as contamination in the process chamber 202. The wafer W and the Faraday shield layer 246 are horizontally arranged to keep the distance therebetween constant, thereby ensuring a high planar uniformity of the process on the wafer W.

With the slits 248 radially arranged, the magnetic field generated by the RF antenna 210 is transmitted into the process chamber 202 without being cut off, so that the RF electric field is generated in the process chamber 202, while capacitive component is considerably reduced. As a result, the input energy from the RF antenna 210 is effectively used for generating the plasma.

The coefficient of thermal expansion and the thickness of the Faraday shield layer 246 are specified to decrease thermal stress to be applied to the partition wall 208. Consequently, even if the partition wall 208 is used over a long period of time, and its thermal expansion and contraction are repeated, hardly any cracks are generated in the partition wall 208.

Further, in the etching apparatus 200 shown in FIG. 3, the energy of an RF power applied to the RF antenna 210 is confined in the process vessel 204. In addition, the partition wall 208 does not bear the pressure difference between the outside and inside of the process vessel 204, and thus can be thinner. As a result, a stronger electric field can be formed in the process chamber 202, so that a high-density plasma is excited in the process chamber 202 at a high energy efficiency.

FIG. 5 is an exploded perspective view showing a multi-layer wall 308 used as a modification of the ceiling wall 108 or the partition wall 208.

As shown in FIG. 5, the multi-layer wall 308 has upper and lower dielectric layers 342 and 344 and a conductive Faraday shield layer 346 interposed and expanded horizontally between the upper and lower layers 342 and 344. The Faraday shield layer 346 is provided with a plurality of slits 348 which are arranged essentially radial and equidistant. The center of the radial shape of the slits 348 aligns with the geometric centers of the RF antenna 110 or 210 and the wafer W placed on the susceptor 116.

The Faraday shield layer 346 is loosely accommodated in a bore formed in the multi-layer wall 308, i.e., in a recess 352 formed in the lower layer 344. In other words, there is a gap between the outer surface of the Faraday shield 346 and the inner surface of the recess 352 of the lower layer 344 to absorb their thermal expansion and contraction. A projection 354 having a radial shape is formed at the center of the recess 352 and inserted in the slits 348. The upper and lower dielectric layers 342 and 344, and the Faraday shield layer 346 are staked one on the other without being adhered.

The multi-layer wall 308 may be formed by a method, as follows.

First, first and second alumina substrates to be the upper and lower dielectric layers 342 and 344 are prepared. The fist substrates is shaped to have flat top and bottom surfaces. The second substrate is provided with the recess 352 for accommodating the Faraday shield layer 346 on its top surface. The radially shaped projection 354 to be inserted in the slits 348 is arranged at the center of the recess 352.

On the other hand, a third alumina substrate to be the Faraday shield layer 346 is prepared. The third substrate is provided with the slits at its center. Then, the whole of the substrate is covered and impregnated with a copper sulfate solution, and then is dried. Sequentially, the third substrate is heated at 1,000° C. for one hour in a nitrogen atmosphere, and is turned into a conductive substrate doped with Cu as an impurity.

Then, the third substrate is inserted in the recess 352 in the second substrate, and the first substrate is stacked thereon.

With this process, the multi-layer structure 308 is assembled such that the members are simply stacked one on the other without being adhered.

Where the multi-layer wall 308 is used as the ceiling wall 108 or the partition wall 208, the multi-layer wall 308 is prevented, by the gap between the outer surface of the Faraday shield 346 and the inner surface of the recess 352 of the lower layer 344, from being burdened with thermal stress. Further, the multi-layer wall 308 can be assembled by simply stacking the members, its fabrication cost is lowered.

Unlike the embodiments shown in FIGS. 1 and 4, the present invention can be applied to a plasma processing apparatus other than an etching apparatus, e.g., a film-forming apparatus or an ashing apparatus. The present invention can also be applied to a plasma processing apparatus for a target object other than a semiconductor wafer, e.g., an LCD glass substrate.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for subjecting a target object to a plasma process by using a plasma, comprising:

an airtight process chamber formed in a process vessel;

a support member arranged in said process chamber, for supporting said target object in said process chamber;

a gas supply system for supplying a process gas into said process chamber;

an exhaust system for exhausting and setting said process chamber at a vacuum;

an RF antenna for generating an RF electric field for exciting said process gas in said process chamber to convert said process gas into a plasma, said electric field having an electric field direction which is defined essentially by lines of electric force extending substantially parallel to said target object supported by said support member;

a power supply for supplying an RF power to said RF antenna; and an interposed wall which has an exposed inner surface exposed to said process chamber and is interposed between said process chamber and said RF antenna, said interposed wall having a dielectric matrix layer and a conductive Faraday shield layer arranged in said matrix layer to extend on a plane substantially parallel to said electric field direction, said Faraday shield layer being electrically grounded and having a thickness of about 10 to 100 $\mu$m, wherein, where coefficients of thermal expansion of said matrix layer and said Faraday shield layer are CT1 and CT2, respectively, $0.7 \leq (CT1/CT2) \leq 1.7$ is satisfied, said Faraday shield layer being formed by vapor deposition.

2. The apparatus according to claim 1, wherein said matrix layer consists essentially of aluminum nitride and said Faraday shield layer consists essentially of tungsten.

3. The apparatus according to claim 1, wherein said matrix layer consists essentially of alumina and said Faraday shield layer consists essentially of tungsten.

4. The apparatus according to claim 1, wherein said matrix layer consists essentially of aluminum nitride and said Faraday shield layer consists essentially of carbon.

5. The apparatus according to claim 1, wherein said Faraday shield layer has a plurality of slits extending in directions substantially perpendicular to said electric field direction.

6. The apparatus according to claim 5, wherein said RF antenna is curved such that said lines of electric force of said electric field are formed to concentrically surround a center of said electric field, and said slits are radially arranged to have a center of said slits substantially aligning with said center of said electric field.

7. The apparatus according to claim 1, wherein said interposed wall and said RF antenna are arranged in said process vessel.

8. The apparatus according to claim 7, further comprising a dielectric layer filling a space between an inner surface of said process vessel and said interposed wall, wherein said RF antenna is embedded in said filling layer.

9. The apparatus according to claim 1, wherein said matrix layer comprises an alumina substrate and an alumina layer formed by thermal spraying, which sandwich said Faraday shield layer.

10. An apparatus for subjecting a target object to a plasma process by using a plasma, comprising:

an airtight process chamber formed in a process vessel;

a support member arranged in said process chamber, for supporting said target object in said process chamber;

a gas supply system for supplying a process gas into said process chamber;

an exhaust system for exhausting and setting said process chamber at a vacuum;

an RF antenna for generating an RF electric field for exciting said process gas in said process chamber to convert said process gas into a plasma, said electric field having an electric field direction which is defined essentially by lines of electric force extending substantially parallel to said target object supported by said support member;

a power supply for supplying an RF power to said RF antenna; and an interposed wall which has an exposed inner surface exposed to said process chamber and is interposed between said process chamber and said RF antenna, said interposed wall having a dielectric matrix layer and a conductive Faraday shield layer arranged in said matrix layer to extend on a plane substantially parallel to said electric field direction, said Faraday shield layer being electrically grounded, wherein said Faraday shield layer is a layer formed by subjecting said matrix layer to doping.

11. The apparatus according to claim 10, wherein said Faraday shield layer is arranged in a bore formed in said matrix layer.

12. The apparatus according to claim 11, wherein said matrix layer comprises first and second layers which sandwich said Faraday shield layer and are stacked one on the other to form said bore.

13. The apparatus according to claim 12, wherein said first and second layers, and said Faraday shield layer are stacked one on the other without being adhered.

14. The apparatus according to claim 10, wherein said matrix layer comprises first and second layers which sandwich said Faraday shield layer, and said Faraday shield layer is a layer formed by subjecting one of said first and second layer to doping.

* * * * *